US006721149B1

(12) United States Patent
Shi et al.

(10) Patent No.: US 6,721,149 B1
(45) Date of Patent: Apr. 13, 2004

(54) TUNNELING MAGNETORESISTANCE SPIN-VALVE READ SENSOR WITH $LANIO_3$ SPACER

(75) Inventors: Zhupei Shi, San Jose, CA (US); Qun Wen Leng, San Jose, CA (US); Zi-Weng Dong, Union City, CA (US)

(73) Assignee: Western Digital (Fremont), Inc., Fremont, CA (US)

( * ) Notice: Subject to any disclaimer, the term of this patent is extended or adjusted under 35 U.S.C. 154(b) by 0 days.

(21) Appl. No.: 09/502,370

(22) Filed: Feb. 11, 2000

(51) Int. Cl.[7] .................................................. G11B 5/33

(52) U.S. Cl. .................................................. 360/324.2

(58) Field of Search ........................... 360/324.2, 324.1, 360/324.11, 324.12, 327.3, 327.31, 327.32, 126, 324, 110; 29/663.13, 603.14; 428/677, 678; 148/108; 257/295; 324/252

(56) References Cited

U.S. PATENT DOCUMENTS

| | | | | |
|---|---|---|---|---|
| 5,639,547 A | * 6/1997 | Mitsuoka et al. | 428/332 |
| 5,721,654 A | * 2/1998 | Manako et al. | 360/110 |
| 5,872,502 A | * 2/1999 | Fujikata et al. | 338/32 R |
| 6,004,654 A | * 12/1999 | Shinjo et al. | 324/252 |
| 6,111,729 A | * 8/2000 | Kamiguchi et al. | 360/324.1 |
| 6,198,119 B1 | * 3/2001 | Nabatame et al. | 257/295 |
| 6,201,673 B1 | * 3/2001 | Rottmayer et al. | 360/324.12 |
| 6,205,008 B1 | * 3/2001 | Gijs et al. | 360/324 |
| 6,221,172 B1 | * 4/2001 | Saito et al. | 148/108 |
| 6,329,078 B1 | * 12/2001 | Tsuge | 428/677 |

FOREIGN PATENT DOCUMENTS

| | | |
|---|---|---|
| JP | 63155604 A * | 6/1988 |
| JP | 06267742 A * | 9/1994 |

OTHER PUBLICATIONS

Caballero, J.A. et al., Effect of Deposition Parameters on the CPP–GMR of NiMnSb–Based Spin–Valve Structures, Journal of Magnetism and Magnetic Materials, 1999. pp. 55–57.

Sun, J.Z., et al., "Temperature Dependent, Non–Ohmic Magnetoresistance in Doped Perovskite Manganate Trilayer Junctions," Appl. Phys. Lett., vol. 70, No. 13, Mar. 31, 1997, pp. 1769–1771.

* cited by examiner

*Primary Examiner*—Brian E. Miller
*Assistant Examiner*—Tianjie Chen
(74) *Attorney, Agent, or Firm*—Sawyer Law Group LLP

(57) ABSTRACT

A method and system for providing a magnetoresistive sensor that reads data from a recording media is disclosed. The method and system include providing an antiferromagnetic layer, providing a pinned layer without adversely affecting performance of the magnetoresistance sensor, providing a free layer, and providing an insulating spacer layer disposed between the pinned layer and the free layer. The pinned layer is magnetically coupled to the antiferromagnetic layer. The pinned layer is also a half metallic ferromagnet. The free layer is ferromagnetic. The insulating spacer layer is sufficiently thin to allow tunneling of charge carriers between the pinned layer and the free layer. Furthermore, the insulating spacer layer allows for d-bonding between a portion of the insulating layer and a portion of the free layer and pinned layer layer.

12 Claims, 5 Drawing Sheets

100

Free Layer — 108
Insulating Layer (Allows d-Shell Bonding) — 106
Half Metallic Ferromagnetic Pinned Layer (Provided w/o Performance Suffering) — 104
Antiferromagnet — 102

Figure 2B:
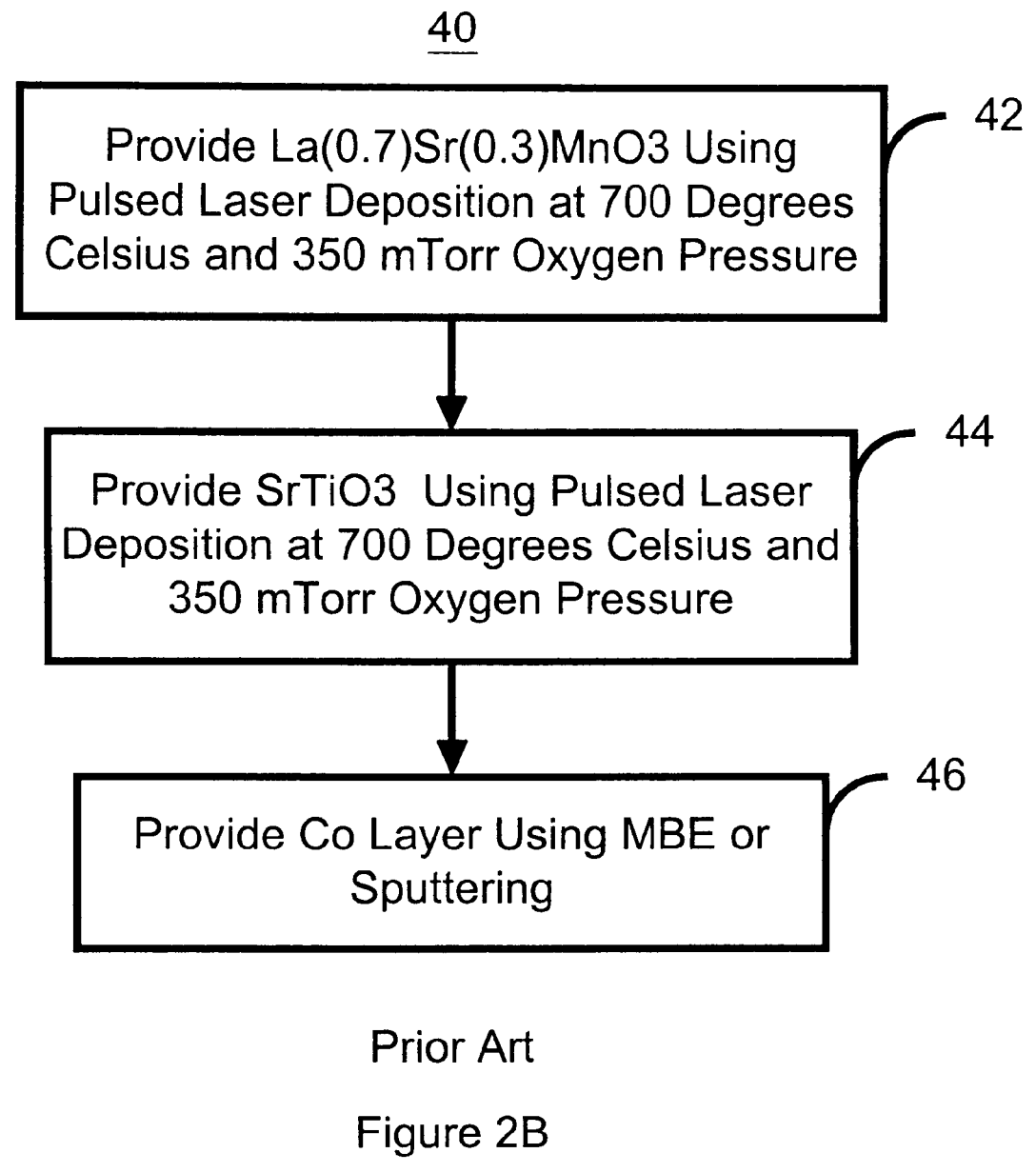

40

Provide La(0.7)Sr(0.3)MnO3 Using Pulsed Laser Deposition at 700 Degrees Celsius and 350 mTorr Oxygen Pressure — 42

Provide SrTiO3 Using Pulsed Laser Deposition at 700 Degrees Celsius and 350 mTorr Oxygen Pressure — 44

Provide Co Layer Using MBE or Sputtering — 46

Prior Art

Second Shield
132
Second Gap
130
Second Lead
128
TMR Sensor
100
First Lead
126
First Gap
124
First Shield
122

TUNNELING MAGNETORESISTANCE SPIN-VALVE READ SENSOR WITH $LANIO_3$ SPACER

FIELD OF THE INVENTION

The present invention relates to magnetic recording technology, and more particularly to a tunneling magnetoresistive read head which is capable of being used in high density magnetic recording and can be easily manufactured.

BACKGROUND OF THE INVENTION

Recently, tunneling magnetoresistive ("TMR") junctions have become of interest for potential use in reading recording media in a magnetoresistive ("MR") head. FIG. 1 is a diagram of a conventional TMR junction 10. Also depicted in FIG. 1 are leads 11 and 19. Not depicted are conventional shields and gaps which would surround the conventional TMR junction 10 if the TMR junction 10 is used as a sensor. The conventional TMR junction 10 includes a conventional antiferromagnetic ("AFM") layer 12, a conventional pinned layer 14, a conventional insulating spacer layer 16 and a conventional free layer 18. The conventional pinned layer 14 and conventional free layer 18 are ferromagnetic. The conventional pinned layer 14 has its magnetization fixed, or pinned, in place because the conventional pinned layer 14 is magnetically coupled to the conventional AFM layer 12. The magnetization of the conventional free layer 18 may be free to rotate in response to an external magnetic field. The conventional pinned layer 14 is typically composed of Co, Fe, or Ni. The conventional free layer 18 is typically composed of Co, $Co_{90}Fe_{10}$, or a bilayer of $Co_{90}Fe_{10}$ and permalloy. The conventional insulating spacer layer 16 is typically composed of aluminum oxide ($Al_2O_3$).

For the conventional TMR junction 10 to function, current is driven between the leads 11 and 19, perpendicular to the plane of the layers 12, 14, 16 and 18 of the conventional TMR junction 10. The MR effect in the conventional TMR junction 10 is believed to be due to spin polarized tunneling of electrons between the conventional free layer 18 and the conventional pinned layer 14. When the magnetization of the conventional free layer 18 is parallel or antiparallel to the magnetization of the conventional pinned layer 14, the resistance of the conventional TMR junction 10 is minimized or maximized. When the magnetization of the conventional free layer 18 is perpendicular to the magnetization of the conventional pinned layer 14, the bias point for the TMR junction 10 is set. The magnetoresistance, MR, of a MR sensor is the difference between the maximum and minimum resistances of the MR sensor. The MR ratio of the MR sensor is typically called $\Delta R/R$, and is typically given as a percent. The intrinsic magnetoresistance of such a conventional TMR junction 10 is approximately seventeen percent.

TMR junctions, such as the conventional TMR junction 10, are of interest for MR sensors for high density recording applications. Currently, higher recording densities, for example over 40 gigabits ("Gb") per square inch, are desired. When the recording density increases, the size of and magnetic field due to the bits decrease. Consequently, the bits provide a lower signal to a read sensor. In order to maintain a sufficiently high signal within a MR read head, the signal from the read sensor for a given magnetic field is desired to be increased. One mechanism for increasing this signal would be to use an MR sensor having an increased MR ratio.

Although the conventional TMR junction 10 is approximately seventeen percent, a higher MR ratio is desired. Some conventional TMR junctions 10 have an increased MR ratio due to the resistance effect of the leads 11 and 19. In such conventional TMR junctions 10, an MR ratio of up to forty percent has been reported. However, the high MR ratio for such conventional TMR junctions 10 is due to lead resistance. The resistance of the leads 11 and 19 is much higher than the resistance of the conventional TMR junction itself of the conventional TMR sensor 10, which is on the order of sixty ohms per micrometer squared. Consequently, the resistance of the combination of the TMR junction 10 and the leads 11 and 19 is high.

One of ordinary skill in the art will readily realize that a high resistance for the conventional TMR sensor 10 and leads 11 and 19 results in a slow response. Because the combination of the conventional TMR junction 10 and leads 11 and 19 have a high resistance, the time constant for the combination is large. As a result, the response time for the conventional TMR junction 10 is long. The large response time results in a low data transfer rate, which is undesirable.

FIG. 2A depicts another conventional TMR junction 20 disclosed in "Inverse Tunnel Magnetoresistance in $Co/SrTiO_3/La_{0.7}Sr_{0.3}MnO_3$: New Ideas on Spin-Polarized Tunneling" J. M. De Teresa, A. Barthelemy, A. Fert, J. P. Contour, R. Lyonnet, F. Montaigne, P. Seneor, and A. Vaures, Phys. Rev. Lett., Vol. 82, No. 21, 4288–4291 (1999). Also depicted in FIG. 1B are leads 21 and 29, which are used to carry current to and from the conventional TRM junction 20. The conventional TMR sensor 20 includes an antiferromagnetic layer 22. Above the antiferromagnetic layer is a conventional $La_{0.7}Sr_{0.3}MnO_3$ (LSMO) pinned layer 24. Above the LSMO pinned layer 24 is a $SrTiO_3$ (STO) insulating layer 26. On the side of the STO insulating layer 26 is a conventional free layer 28 composed of Co or LSMO. The MR ratio of the conventional TMR junction 20 is higher than that of the conventional TMR junction 10.

FIG. 2B depicts a conventional method 40 for forming the conventional TMR junction 20. The LSMO pinned layer 24 is provided using pulsed laser deposition at seven hundred degrees Celsius and an oxygen pressure of three hundred and fifty millitorr, via step 42. The STO insulating layer 26 is then provided using pulsed laser deposition at seven hundred degrees Celsius and an oxygen pressure of three hundred and fifty millitorr, via step 44. The conventional pinned layer 28 of Co is then provided using molecular beam epitaxy or sputtering, via step 46.

Referring to FIGS. 2A and 2B, the conventional TMR junction 20 utilizes the STO insulating layer 26 in order to improve the MR for the conventional TMR junction 20. It is believed that d-shell electrons can tunnel more readily through the STO insulating layer 26 than through an insulating layer such as the aluminum oxide insulating spacer layer 16 used in the conventional TMR junction 10. Ferromagnetic materials, such as Co, have d-shell electrons in their unfilled shell. Moreover, the magnetic properties of many ferromagnetic materials are dominated by the d-shell electrons. The STO insulating layer 26 more readily forms d electron bonds with the conventional free layer 28 at the interface between the STO insulating layer 26 and the conventional free layer 28. As a result, it is believed that the d-shell electrons from the conventional free layer 28 can more readily tunnel through the STO insulating layer 26. The same is true for the STO insulating layer 26 and the conventional LSMO pinned layer 24. As a result, tunneling of spin polarized electrons is more likely to take place in the conventional TMR junction 20 than in the conventional TMR junction 10, which has an insulating spacer layer 16 of aluminum oxide through which s-shell electrons are more likely to tunnel. Therefore, the MR ratio of the conventional TMR junction 20 is higher.

In addition, the LSMO pinned layer 24 is what is known as a half metallic ferromagnet. A half metallic ferromagnet has electrons of only one spin type in its unfilled shells. The spin polarization of a material is proportional to the number of spin up electrons in the material's unfilled shell minus the number of spin down electrons in the material's unfilled shell. The spin polarization is typically expressed as a percentage. Thus, a half metallic ferromagnet has a spin polarization of one hundred percent. It has been postulated that the MR ratio for a TMR junction is $2*P_1*P_2/(1+P_1*P_2)$, where $P_1$and $P_2$ are the spin polarizations of the free layer and the pinned layer, respectively. For the TMR junction 20, the MR ratio is increased because $P_2$ is one hundred percent (or one, expressed as a fraction). As a result, the MR ratio for the conventional TMR junction 20 is increased, and has been observed to reach approximately fifty percent.

Although the conventional TMR junction 20 has improved MR, one of ordinary skill in the art will readily realize that the TMR junction 20 may not be suitable for use as a sensor in a MR head. In particular, the TMR junction 20 is formed using very high temperature and energy deposition techniques for both the LSMO pinned layer 24 and the STO insulating spacer layer 26. As a result, the TMR junction 20 itself and other structures which may be used in a MR head, such as shields or leads, may be damaged. As a result, the performance of the TMR junction 20 is adversely affected. Because the LSMO pinned layer 24 is deposited using high temperature laser ablation, the conventional AFM layer 22 may be heated during deposition of the LSMO pinned layer 24. Heating of the AFM layer 22 may change the crystal structure of the AFM layer 22, thereby changing the magnetic properties of the AFM layer 22. Consequently, the AFM layer 22 will be less able to pin the magnetization of the LSMO pinned layer 24 in the desired direction. The TMR junction 20 may not, therefore, function as desired. Furthermore, other structures such as the shields or (not shown in FIGS. 1, 2A or 2B) or lead 21 may be damaged by heating during deposition of the LSMO pinned layer 24 or the STO insulating layer 26. If the shields are damaged, the shields may not adequately perform their desired function, screening the TMR junction 20 from the magnetic due to bits which are not being read. As a result, the TMR junction 20 may read spurious magnetic fields as part of the magnetic field of the bit desired to be read. Performance of the TMR junction 20 may, therefore, be adversely affected because of the deposition of the LSMO pinned layer 24 and, to a lesser extent, the deposition of the STO insulating layer 26.

Accordingly, what is needed is a system and method for providing a TMR sensor which is capable of reading information stored on magnetic recording media at higher densities and which can be fabricated without adversely affecting the performance of the TMR sensor. The present invention addresses such a need.

SUMMARY OF THE INVENTION

The present invention provides a method and system for providing a magnetoresistive sensor that reads data from a recording media. The method and system comprise providing an antiferromagnetic layer, providing a pinned layer without adversely affecting performance of the magnetoresistance sensor, providing a free layer, and providing an insulating spacer layer disposed between the pinned layer and the free layer. The pinned layer is magnetically coupled to the antiferromagnetic layer. The pinned layer is also a half metallic ferromagnet. The free layer is magnetic. The insulating spacer layer is sufficiently thin to allow tunneling of charge carriers between the pinned layer and the free layer. Furthermore, the insulating spacer layer allows for d-bonding between a portion of the free layer and a portion of the insulating spacer layer.

According to the system and method disclosed herein, the present invention provides a tunneling magnetoresistive sensor which has a high magnetoresistance and which can be fabricated using techniques which will not adversely affect the performance of the magnetoresistive sensor. Consequently, the MR head is capable of reading higher density recording media and fabricated using techniques similar to those currently used for conventional magnetoresistive heads.

BRIEF DESCRIPTION OF THE DRAWINGS

FIG. 2B is a flow chart depicting a conventional method for providing the second conventional tunneling magnetoresistive junction.

DETAILED DESCRIPTION OF THE INVENTION

Figure 1:
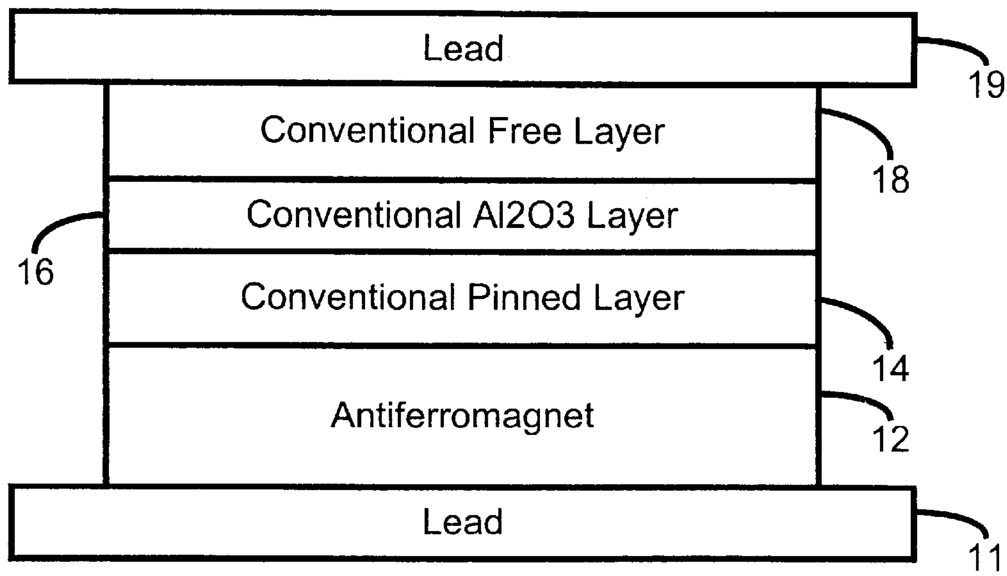
FIG. 1 is a diagram of a conventional tunneling magnetoresistive junction.
Figure 2A:
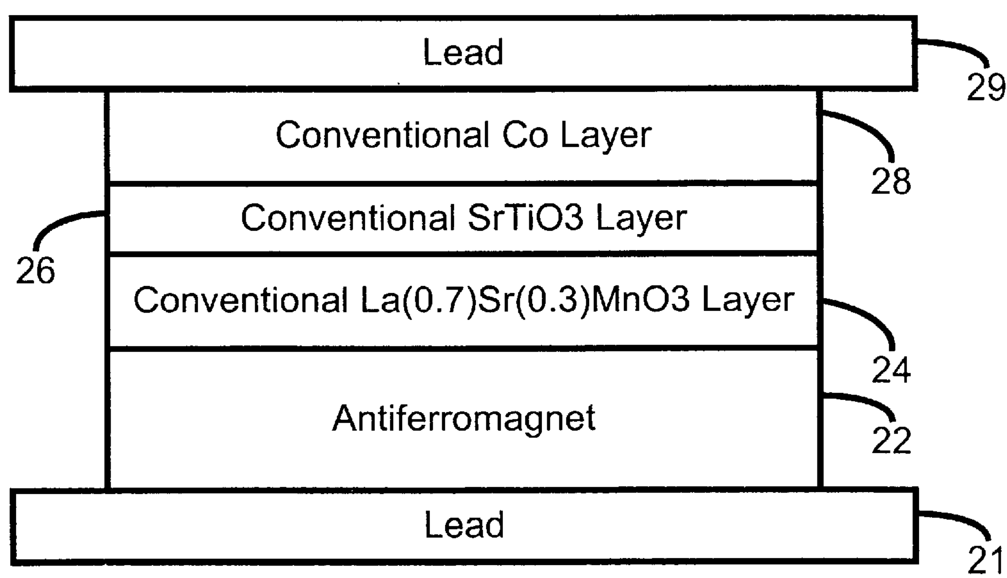
FIG. 2A is a diagram of a second conventional tunneling magnetoresistive junction.

The present invention relates to an improvement in magnetoresistive heads. The following description is presented to enable one of ordinary skill in the art to make and use the invention and is provided in the context of a patent application and its requirements. Various modifications to the preferred embodiment will be readily apparent to those skilled in the art and the generic principles herein may be applied to other embodiments. Thus, the present invention is not intended to be limited to the embodiment shown, but is to be accorded the widest scope consistent with the principles and features described herein.

Tunneling magnetoresistive ("TMR") junctions are of increasing interest for use as magnetoresistive ("MR") sensors in MR heads. TMR junctions rely on tunneling of spin polarized electrons through an insulating layer between two magnetic layers, a conventional free layer and a conventional pinned layer. In order to increase the MR ratio, $\Delta R/R$, for conventional TMR junctions, two proposals have been made. The first uses an increased resistance in the leads carrying current to and from the conventional TMR junction in order to increase the MR ratio. However, this results in a very high resistance for the combination of the conventional TMR junction and the leads. Consequently, an MR head built with such a combination would have a slow response time and, therefore, a low data rate. These properties are undesirable. A second conventional TMR junction utilizes a $La_{0.7}Sr_{0.3}MnO_3$ ("LSMO") pinned layer and a $SrTiO_3$ ("STO") insulating spacer layer. Because of the properties of the LSMO pinned layer and the STO insulating spacer layer, the MR ratio for the second conventional TMR junction is increased. However, one of ordinary skill in the art will readily recognize that the conventional techniques used to provide the second conventional TMR junction can adversely affect the performance of the TMR junction when used as a MR sensor. In particular, high temperature laser ablation is used to provide the LSMO pinned layer and the STO insulating spacer layer. The high temperature used in providing, for example, the LSMO spacer layer can damage portions of the sensor or the head, such as AFM layer of the conventional TMR junction, and possibly the shield or leads. As a result, the second TMR junction may not function as desired in the MR head. Thus, the second conventional TMR sensor may not be suitable for use as a MR sensor.

The present invention provides a method and system for providing a magnetoresistive sensor that reads data from a recording media. The method and system comprise providing an antiferromagnetic layer, providing a pinned layer without adversely affecting performance of the magnetoresistance sensor, providing a free layer, and providing an insulating spacer layer disposed between the pinned layer and the free layer. The pinned layer is magnetically coupled to the antiferromagnetic layer. The pinned layer is also a half metallic ferromagnet. The free layer is magnetic. The insulating spacer layer is sufficiently thin to allow tunneling of charge carriers between the pinned layer and the free layer. Furthermore, the insulating spacer layer allows for d-bonding between a portion of the free layer and a portion of the insulating spacer layer. The insulating spacer layer also preferably allows for d-bonding between a portion of the insulating spacer layer and a portion of the pinned layer.

The present invention will be described in terms of particular materials used, a particular head, and a particular configuration of the TMR sensor. However, one of ordinary skill in the art will readily recognize that this method and system will operate effectively for other materials and other configurations of the TMR sensor of the MR head consistent with the present invention. For example, the present invention is consistent with the use of a spin valve, a dual spin valve, a synthetic spin valve, or other magnetoresistive sensor. Furthermore, the present invention can be used in a simple read head, a merged head, or another head which utilizes a TMR sensor as described herein.

Figure 3A:
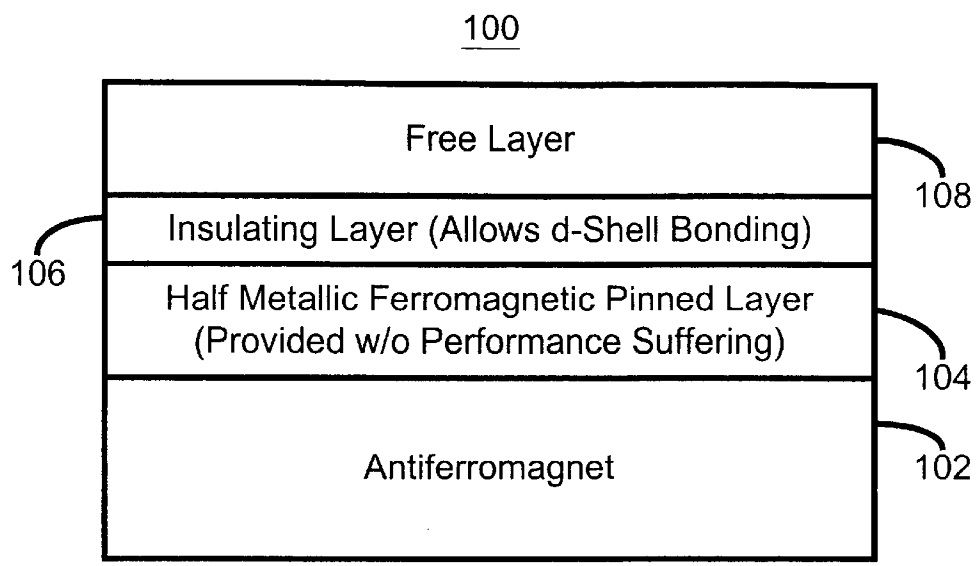
FIG. 3A is a diagram of one embodiment of a tunneling magnetoresistive sensor in accordance with the present invention.

To more particularly describe the present invention, refer to FIG. 3A, depicting one embodiment of a TMR sensor 100 in accordance with the present invention. The TMR sensor 100 includes an antiferromagnetic (AFM) layer 102, a pinned layer 104, an insulating spacer layer 106 and a free layer 108. The free layer 108 is preferably Co, $Co_{90}Fe_{10}$ or a bilayer of $Co_{90}Fe_{10}$ and permalloy. The pinned layer 104 is preferably a half metallic ferromagnet. The pinned layer 104 is also composed of a material such that providing the pinned layer 104 for the TMR sensor 100 does not adversely affect the performance TMR sensor 100. In a preferred embodiment, the pinned layer 104 is a Heusler alloy NiMnSb. In another embodiment, the pinned layer 104 may include $Fe_3O_4$, $CrO_2$, $CoO_2$, $CoS_2$, $Nd_{0.7}Sr_{0.3}MnO_3$ or another material which can be provided without adversely affecting the performance of the TMR sensor 100. Similarly, in a preferred embodiment, the insulating spacer layer 106 is also provided in a manner which will not adversely affect the performance of the TMR sensor 100. Moreover, the insulating spacer layer 106 sufficiently thin to allow tunneling of charge carriers between the pinned layer 104 and the free layer 108 during operation of the TMR sensor. Furthermore, the insulating spacer layer 106 has a structure which allows for d-bonding between a portion of the free layer 108 and a portion of the insulating spacer layer 106. Thus, the insulating spacer layer 106 is preferably an STO layer, which is known to allow for d-shell bonding between the Ti in the STO and at least Co. In another embodiment, the insulating spacer layer may include $LaNiO_3$, which also allows for d-shell bonding between the Ni in the $LaNiO_3$ and Co. In a preferred embodiment, the insulating spacer layer 106 also allows for d-shell bonding between a portion of the insulating spacer layer 106 and the pinned layer 104. In a preferred embodiment, antiferromagnetic layer 102 is approximately fifty to five hundred Angstroms thick, the pinned layer 104 is approximately ten to fifty Angstroms thick, the insulating spacer layer 106 is five to twenty Angstroms thick and the free layer 108 is ten to one hundred Angstroms thick.

Because a half metallic ferromagnet is used for the pinned layer 104, the spin polarization of the pinned layer 1 04 is maximized. As discussed previously, the tunneling MR ratio for a TMR junction is proportional to $2*P_1P_2/(1+P_1*P_2)$, where $P_1$ and $P_2$ are the spin polarizations of the free layer 108 and the pinned layer 104, respectively. Thus, the tunneling MR ratio for the TMR sensor 100 is increased. Furthermore, use of a material in the insulating spacer layer 106 that allows for d-shell bonding between the free layer 108 and the insulating spacer layer 106 improves the ability of d-shell electrons to undergo spin polarized tunneling through the insulating spacer layer 106. As a result, the MR for the TMR sensor 100 is also increased above that for a conventional TMR sensor for which s-shell electrons are more likely to tunnel. It is believed that the tunneling MR for the TMR sensor 100 may be capable of being fifty percent or more at room temperature. Furthermore, the pinned layer 104 can be provided without adversely affecting the performance of the TMR sensor 100. In particular, the AFM layer 102 may not be damaged when the pinned layer 104 is provided. Furthermore, other portions of the TMR sensor 100 and other portions of the MR head (not shown) are not damaged when the pinned layer 104 is provided. As a result, the TMR sensor 100 may be capable of providing better performance.

Figure 3B:
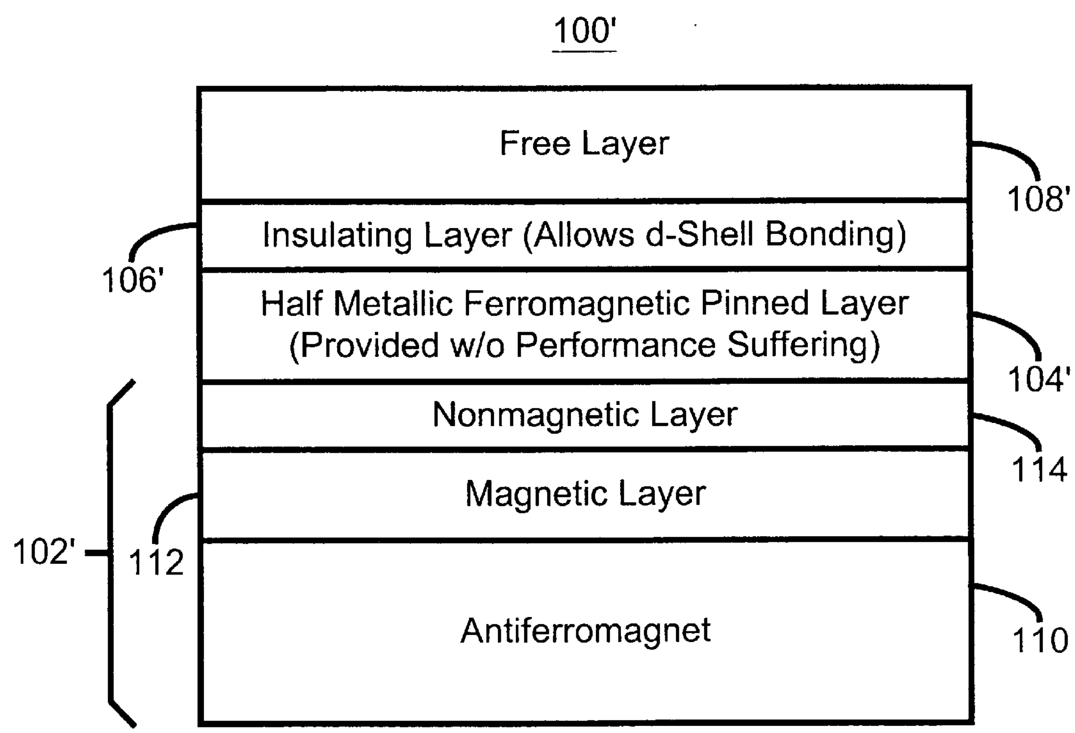
FIG. 3B is a diagram of a second embodiment of a tunneling magnetoresistive sensor in accordance with the present invention.

FIG. 3B depicts another embodiment of the TMR sensor 100'. The pinned layer 104', the insulating spacer layer 106' and the free layer 108' are substantially the same as the pinned layer 104, the insulating spacer layer 106 and the free layer 108 shown in FIG. 3A. Referring back to FIG. 3B, the free layer 108' is preferably Co, $Co_{90}Fe_{10}$ or a bilayer of $Co_{90}Fe_{10}$ and permalloy. The pinned layer 104' is preferably a half metallic ferromagnet. The pinned layer 104' is also composed of a material such that providing the pinned layer 104' for the TMR sensor 100' does not adversely affect the performance TMR sensor 100'. In a preferred embodiment, the pinned layer. 104' is a Heusler alloy NiMnSb. In another embodiment, the pinned layer 104 may include $Fe_3O_4$, $CrO_2$, $CoO_2$, $CoS_2$, $Nd_{0.7}Sr_{0.3}MnO_3$ or another material which can be provided without adversely affecting the, performance of the TMR sensor 100'. Similarly, in a preferred embodiment, the insulating spacer layer 106' is also provided in a manner which will not adversely affect the performance of the TMR sensor 100'. In a preferred embodiment, antiferromagnetic layer 102' is approximately fifty to five hundred Angstroms thick, the pinned layer 104' is approximately ten to fifty Angstroms thick, the insulating spacer layer 106' is five to twenty Angstroms thick and the free layer 108' is ten to one hundred Angstroms thick.

The TMR sensor 100' thus can have a large MR and can function to provide a larger signal in response to the magnetic field from a bit (not shown). These advantages are provided because the insulating spacer layer 106' allows for tunneling of spin polarized electrons and allows for d-shell bonding at the interface between the spacer layer 106' and the free layer 108' and because, in a preferred embodiment, the insulating spacer layer 106' also allows for d-shell bonding between a portion of the insulating spacer layer 106' and the pinned layer 104'. The advantages can also be realized because the pinned layer 104' is a half metallic ferromagnet and because the pinned layer 104' can be provided without adversely affecting the performance of the TMR sensor 100'. The advantages are also realized because the pinned layer 104' does not adversely affect other portions of the TMR sensor 100', such as the synthetic AFM layer 102', or other portions of the MR head (not shown) in which the TMR sensor 100' may be used. Thus, the TMR sensor 100' can provide many of the advantages of the TMR sensor 100.

The TMR sensor 100' also includes a synthetic AFM layer 102'. The synthetic AFM layer 102' is used to pin the magnetization of the pinned layer 104'. The synthetic AFM layer 102' preferably includes an AFM layer 110, a magnetic layer 112 and a nonmagnetic layer 114. The AFM layer 110 aids in pinning the magnetization of the magnetic layer 112 in a desired direction. The nonmagnetic layer 114 has a thickness that allows for antiferromagnetic coupling between the pinned layer 104' and the magnetic layer 112. This relatively strong antiferromagnetic coupling between the magnetic layer 112 and the pinned layer 104' pins the magnetization of the pinned layer 104' in the desired direction. The pinning of the magnetization of the pinned layer 104' may be more complete than for the pinned layer 104 of the TMR sensor 100 depicted in FIG. 3A. Referring back to FIG. 3B, the magnetic layer 112 is preferably Co, the nonmagnetic layer is preferably Ru, and the AFM layer 112 is preferably PtMn. The pinned layer 104 is preferably the Heusler alloy NiMnSb. Furthermore, a metallic pinned layer 104' is preferred because the antiferromagnetic coupling between the pinned layer 104' and the magnetic layer 112 may be significantly more difficult to establish when the pinned layer 104' is an insulator or oxide.

Figures 4, 5A:
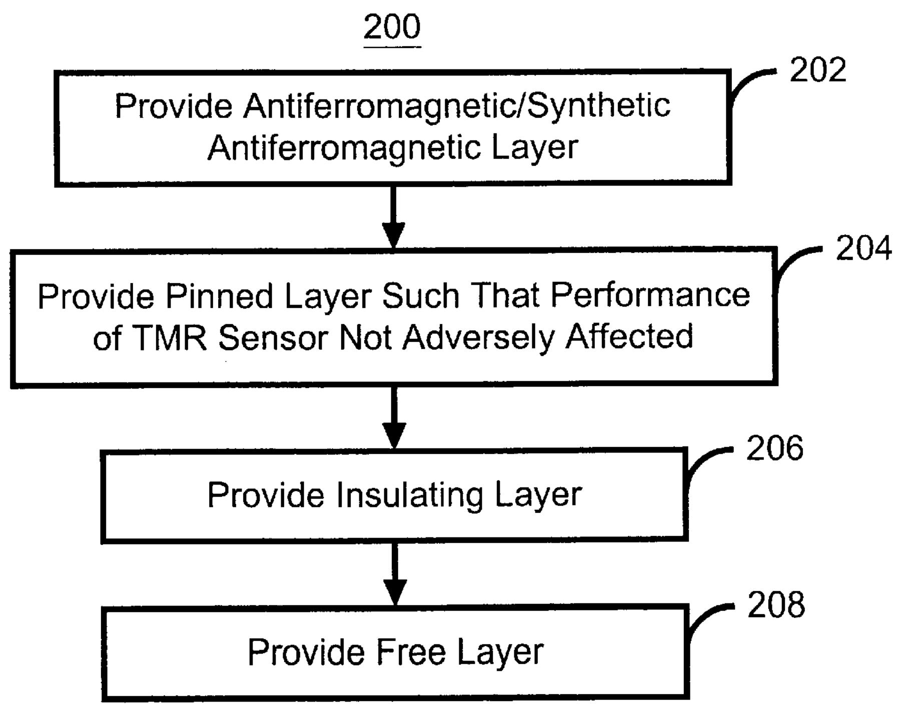
FIG. 4 is a diagram of a portion of one embodiment of the magnetoresistive head in accordance with the present invention.
FIG. 5A is a flow chart depicting one embodiment of a method for providing a tunneling magnetbresistive sensor in accordance with the present invention.

FIG. 4 depicts a portion of an MR head 120 which utilizes the TMR sensor 100 as a read sensor. Note that the MR head 120 could be part of a merged head which also includes a write head (not shown). Although the MR head 120 is depicted as including the TMR sensor 100, the TMR sensor 100' could be included in the MR head 120 in lieu of the TMR sensor 100. The MR head 120 includes first and second shields 122 and 132, respectively, as well as first and second gaps 124 and 130, respectively. The first and second shields 122 and 132 shield the TMR sensor 100 from magnetic fields due to adjacent bits (not shown) which are not desired to be read. Thus, the TMR sensor 100 will be exposed primarily to the magnetic field of the bit which is to be read. The first and second gaps 124 and 130, respectively, are insulators that insulate the TMR sensor 100 from the shields 122 and 132, respectively. The MR head 120 also includes leads 126 and 128. The leads 126 and 128 are used to carry current to and from the TMR sensor 100. Note that the MR head 120 could include other components which are not shown, such as a seed layer and capping layer for the TMR sensor 100 or 100'.

Because the MR head 120 utilizes the TMR sensor 100 or 100', the MR head 120 may be capable of reading higher density recording media. The TMR sensor 100 and 100' have a higher MR ratio than a conventional TMR sensor and is not damaged during formation of the TMR sensor 100 and 100', respectively. Furthermore, portions of the MR head 120, such as the shield 122 or lead 124 are not damaged during formation of the pinned layer 104 and 104' of the TMR sensor 100 and 100', respectively. It is believed that the high MR ratio may allow the MR head 120 to read at densities of 40 Gb/square inch and higher.

FIG. 5A depicts one embodiment of a method 200 for providing the TMR sensor 100 or 100' in accordance with the present invention. The AFM layer 102 or synthetic AFM 102' is provided, via step 202. The pinned layer 104 or 104' is then provided such that the operation of the sensor 100 or 100', respectively, is not adversely affected, via step 204. In a preferred embodiment, the pinned layer 104 or 104' is sputtered or deposited using chemical vapor deposition ("CVD"). For example, NiMnSb layer may be provided by sputtering the layer at a temperature of up to two hundred and fifty degrees Celsius. This temperature is comparable to temperatures already used to fabricate conventional commercial metallic spin valves. Deposition of the pinned layer 104 or 104' under such conditions precludes damage to the TMR sensor 100 or 100' as well as portions of the head 120. For example, a temperature of not more than four hundred degrees Celsius is desired to be used to help prevent damage to the TMR sensor 100 and 100', as well as to prevent damage to other portions of the head 120. As a result, operation of the TMR sensor 100 or 100' is not adversely affected. The insulating layer 106 or 106' is then provided, via step 206. In a preferred embodiment, the insulating layer 106 or 106' is also provided such that operation of the TMR sensor 100 and 100' is not affected. For example, sputtering of NiMnSb for the pinned layer 102 and 102' can be carried out at temperatures of up to two hundred and fifty degrees Celsius. Similarly, the insulating layer may be deposited using CVD. These temperatures do not heat the AFM layer 102 or the synthetic AFM 102' sufficiently to change the structure of the AFM layer 102 or the synthetic AFM 102'. Thus, it is preferred that the temperature not be over four hundred degrees Celsius. Thus, the magnetic properties of the AFM layer 102 and the synthetic AFM 102' remain unchanged during deposition of the pinned layer 104 and 104', respectively, and the insulating layer 106 and 106', respectively. Consequently, the AFM layer 102 or the synthetic AFM 102' remains capable of pinning the magnetization of the pinned layer 104 and 104', respectively, in the desired direction.

Figure 5B:
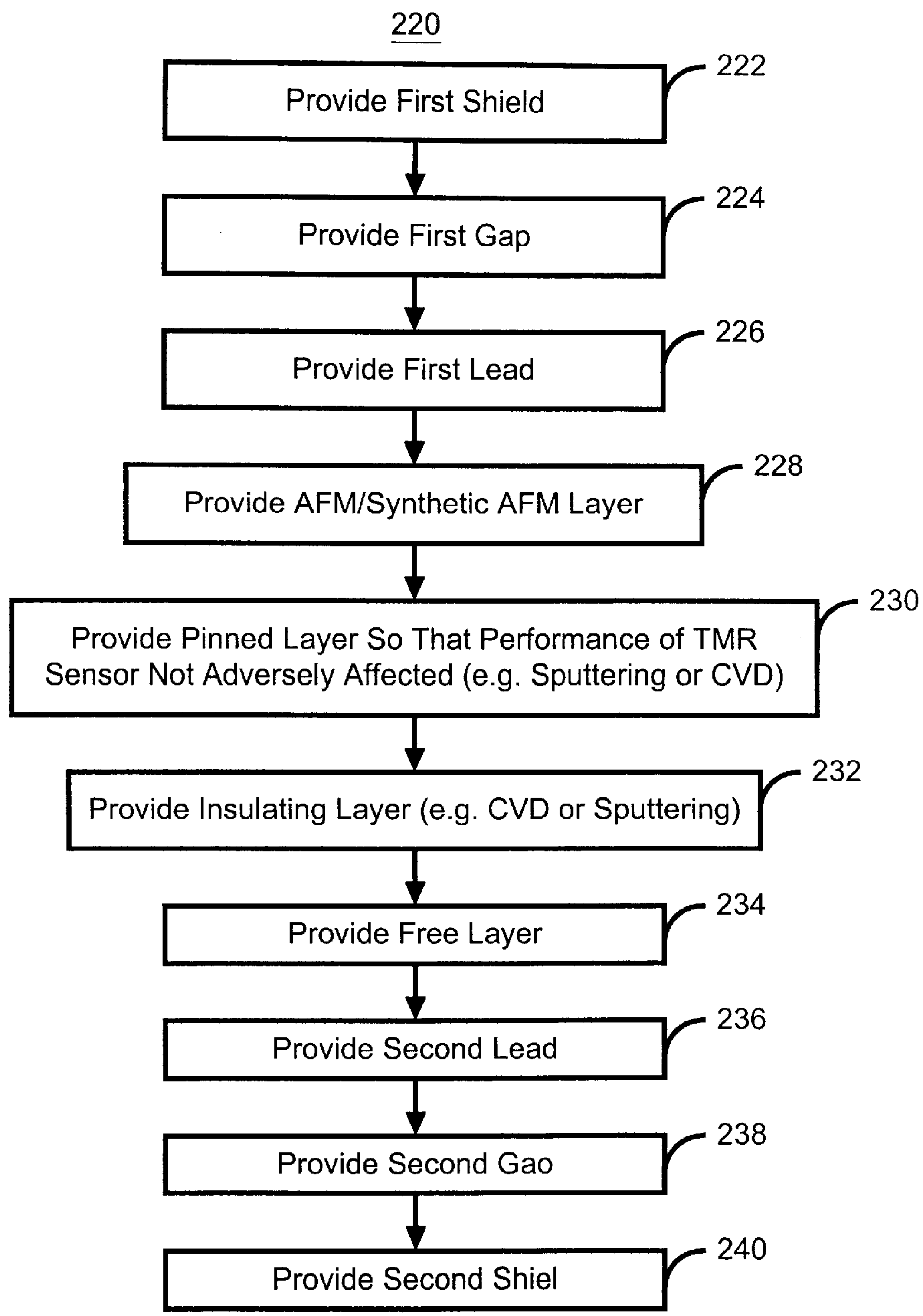
FIG. 5B is a flow chart depicting one embodiment of a method for providing a tunneling magnetoresistive as incorporated into a magnetoresistive head in accordance with the present invention.

FIG. 5B depicts another embodiment of a method 220 for providing a MR head, such as the MR head 120, in accordance with the present invention. The first shield 122 is provided, via step 222. The first gap 124 and lead 126 are provided, via steps 224 and 226, respectively. The AFM layer 102 or synthetic AFM 102' is then provided, via step 228. Note that a seed layer may be provided before the AFM layer 102 or synthetic AFM layer 102' are provided. If the synthetic AFM layer 102' is provided in step 228, then step 228 preferably includes providing an AFM layer, providing a magnetic layer and providing a nonmagnetic layer. The pinned layer 104 or 104' is then provided, via step 230. Step 230 may include sputtering the pinned layer 104 or 104' or providing the pinned layer 104 or 104' by CVD. In a preferred embodiment, the pinned layer 104 or 104' is a Heusler allow of NiMnSb and is sputtered at a temperature of up to approximately two hundred and fifty degrees Celsius. The insulating spacer layer 106 or 106' is then provided, via step 232. In a preferred embodiment, step 232 includes providing a layer of $SrTiO_3$ using CVD. Thus, deposition of the insulating layer also does not adversely affect the performance of the TMR sensor 100 or 100'. The free layer 108 or 108' is then provided, via step 234. The lead 128, second gap 130 and second shield 132 are then provided, via steps 236, 238 and 240, respectively.

Using the methods 200 or 220, the TMR sensor 100 and 100' can be provided in the head 120. Because the pinned layer 104 and 104' is provided without adversely affecting the operation of the TMR sensor 100 and 100', the TMR sensor 100 and 100' can be used to read higher density recording media. For example, the pinned layer 104 and 104', as well as the insulating layers 106 and 106', can be provided without raising the temperature of the TMR sensor 100 or 100' or the head 120 to high temperatures such as seven hundred degrees Celsius. As a result, the AFM layer 102 and the synthetic AFM 102' retain the desired magnetic properties. Furthermore, structures, such as the shield 122 or lead 126, may not be damaged or destroyed. Consequently, the TMR sensor 100 and 100' can function as desired. Furthermore, the TMR sensor 100 and 100' can have higher MR because of the use of a half metallic ferromagnet, or other material having a high spin polarization, and because the insulating spacer layer 106 and 106', respectively, allows for improved tunneling of d-shell electrons.

A method and system has been disclosed for providing a tunneling magnetoresistance sensor that can operate at higher track densities. Although the present invention has been described in accordance with the embodiments shown, one of ordinary skill in the art will readily recognize that there could be variations to the embodiments and those variations would be within the spirit and scope of the present invention. Accordingly, many modifications may be made by one of ordinary skill in the art without departing from the spirit and scope of the appended claims.

What is claimed is:

1. A magnetoresistive sensor for reading data from a recording media comprising:

an antiferromagnetic layer;

a pinned layer magnetically coupled to the antiferromagnetic layer, the pinned layer being a half metallic ferromagnet, the pinned layer further being capable of being provided without adversely affecting performance of the magnetoresistive sensor;

a free layer, the free layer being magnetic; and an insulating spacer layer disposed between the pinned layer and the free layer, the insulating spacer layer being sufficiently thin to allow tunneling of charge carriers between the pinned layer and the free layer, the insulating spacer layer allowing for d-bonding between a portion of the free layer and a portion of the insulating spacer layer;

wherein the pinned layer is provided such that the antiferromagnetic layer has a crystal structure substantially as deposited;

wherein the insulating spacer layer further includes $LaNiO_3$.

2. The magnetoresistive sensor of claim 1 wherein the pinned layer is deposited using chemical vapor deposition.

3. The magnetoresistive sensor of claim 1 wherein the pinned layer is deposited using sputtering.

4. The magnetoresistive sensor of claim 1 wherein the pinned layer further includes a Heusler alloy NiMnSb.

5. The magnetoresistive sensor of claim 1 wherein the pinned layer further includes $Fe_3O_4$.

6. The magnetoresistive sensor of claim 1 wherein the pinned layer further includes $CrS_2$.

7. The magnetoresistive sensor of claim 1 wherein the pinned layer further includes $Nd_{0.7}Sr_{0.3}MnO_3$.

8. The magnetoresistive sensor of claim 1 wherein the insulating spacer layer further includes $SrTiO_3$.

9. The magnetoresistive sensor of claim 1 wherein the antiferromagnetic layer further includes a synthetic antiferromagnet.

10. The magnetoresistive sensor of claim 9 wherein the synthetic antiferromagnet further includes a layered structure including a first antiferromagnetic layer, a magnetic layer and a nonmagnetic layer, the nonmagnetic layer being in proximity to the pinned layer and having a thickness such that the pinned layer is antiferromagnetically coupled with the magnetic layer.

11. The magnetoresistive sensor of claim 10 wherein the first antiferromagnetic layer includes a PtMn layer, the magnetic layer includes a Co layer and the nonmagnetic layer includes a Ru layer, the Ru layer being in proximity to the pinned layer such that the pinned layer is antiferromagnetically coupled with the magnetic layer.

12. The magnetoresistive sensor of claim 1 wherein the pinned layer is provided using temperatures not greater than four hundred degrees Celsius such that the antiferromagnetic layer has the crystal structure substantially as provided.

* * * * *